US005252499A

United States Patent [19]
Rothschild

[11] Patent Number: 5,252,499
[45] Date of Patent: Oct. 12, 1993

[54] WIDE BAND-GAP SEMICONDUCTORS HAVING LOW BIPOLAR RESISTIVITY AND METHOD OF FORMATION

[76] Inventor: G. F. Neumark Rothschild, 153 Old Colony Rd., Hartsdale, N.Y. 10530

[21] Appl. No.: 232,405

[22] Filed: Aug. 15, 1988

[51] Int. Cl.$^5$ .......................................... H01L 21/265
[52] U.S. Cl. ........................................ 437/22; 437/24; 437/937; 148/DIG. 69; 148/DIG. 84
[58] Field of Search .......................... 437/937, 22, 24; 148/DIG. 69, DIG. 84

[56] References Cited

U.S. PATENT DOCUMENTS

| | | | |
|---|---|---|---|
| 3,218,204 | 11/1965 | Ruehrwein | 148/DIG. 69 |
| 3,578,507 | 5/1971 | Chiang et al. | 437/150 |
| 4,105,478 | 8/1978 | Johnson | 437/3 |
| 4,422,888 | 12/1983 | Stutius | 437/81 |
| 4,526,632 | 7/1985 | Nishizawa et al. | 437/127 |
| 4,610,731 | 9/1986 | Chevallier et al. | 437/24 |
| 4,632,711 | 12/1986 | Fujita | 437/105 |
| 4,685,979 | 8/1987 | Nishizawa | 437/81 |
| 4,725,563 | 2/1988 | Nishizawa | 437/114 |
| 4,735,910 | 4/1988 | Mitsuyu et al. | 437/22 |
| 4,751,149 | 6/1988 | Vijayakumar | 428/938 |
| 4,755,856 | 7/1988 | Nishizawa | 437/80 |
| 4,783,426 | 11/1988 | Nishizawa | 437/81 |
| 4,851,302 | 7/1989 | Nakagawa et al. | 437/105 |

FOREIGN PATENT DOCUMENTS

62-18720  1/1987  Japan .................................. 437/937

OTHER PUBLICATIONS

Yoshikawa et al., "Autodoping effects near the interface of CDS-GaAs Junction 4, J. Applied Physics vol. 13 (1974), No. 3.

Bonnet et al. "New Results on The Development of a Thin Film P-CdTe-A-Cds. Hetero Junction Solar Cell", Conference Record of the 9th IEEE Photovoltaic Specialists Conference, 1972.

Pogg et al. "Doping behavior of silica in vapor grown III-VE Pitaxial Films", Journal of Crystal Growth 31 (1975) 183-189.

Glandhi, "VLSI Fabrication Principles", John Wiley and Sons, 1983.

"Electrical and photo-luminescence properties of ZnSe . . . ," Fan et al., Journal of electronic materials, vol. 15, No. 4, pp. 251-255, Jul. 1986.

"Vapor phase epitaxial growth and characterization of ZnS . . . ," Iida et al., J. cryst. growth, vol. 72, No. 1-2, pp. 51-56, Jul. 1985.

Patterson et al, "The growth and characterization of low resistivity n-type ZnSySe-y . . . ", J. electron. mater., vol. 13, No. 4, pp. 621-633, Jul. 1984.

Dean, et al, "Ionization Energy of Shallow N Acceptor ZnSe", (1983), Physical Review B, vol. 27, No. 4, pp. 2419-2428.

Fitzpatrick, et al, "N as a Shallow Acceptor in ZnSe", (1981), Extended Abstracts of the Electrochem Soc., vol. 81, pp. 408-409.

Fitzpatrick, et al, "Spectroscopic Studies of ZnSe", (1981), IEEE Transactions on Electron Devices, vol. ED-28 No. 4, pp. 440-444.

Chum-teh et al, "Low-resistance Contacts to p-type Li-diffused CdTe", (1983), J. Appl. Phys. 54 (12), pp. 7041-7046.

Robinson and Kun, "P-n Junction Zinc Sulfo-selenide and ZnSe LED's", Appl. Phys. Lets. 27 (2), pp. 74-76, Jul. 15, 1975.

(List continued on next page.)

Primary Examiner—Robert Kunemund
Assistant Examiner—Ourmazd S. Ojan
Attorney, Agent, or Firm—Blum Kaplan

[57] ABSTRACT

A wide band-gap semiconductor, such as a II-VI semiconductor having low bipolar resistivity and a method for producing such a semiconductor. To form this semiconductor, atomic hydrogen is used to neutralize compensating contaminants. Alternatively, the semiconductor dopant and hydrogen are introduced into the undoped semiconductor together, and later, the hydrogen is removed leaving an acceptably compensation free wide band-gap semiconductor.

22 Claims, No Drawings

OTHER PUBLICATIONS

Magnea et al, "Sem and Photolum. Study of Li Seg. and Annealed ZnTe", (1978), Sol. State. Com., vol. 29, pp. 35-38.

Kun, "The Variation or Residual Impurities in ZnSe Crystals" (1981), J. Appl. Phys. 53 (2), pp. 1248-1250.

N. Pan, et al., "Hydrogen Passivation of C Acceptors in High-Purity GaAs", *Appl. Phys. Lett.,* 51:8, Aug. 24, 1987, pp. 596-598.

N. Stucheli, et al., "p-ZnSe/n-GaAs Heterojunctions for Blue Electroluminescent Cells", *The Physics of Semiconductors,* pp. 223-226 (World Scientific 1987).

L. Svob and Y. Marfaing, "Hydrogen-Acceptor Interaction in CdTe and ZnTe Studied by Photoluminescence," *Solid State Communications,* 58:6, pp. 343-346 (1986).

G. F. Neumark and S. P. Herko, "Li Doped ZnSe and Problems of p-type Conduction", *J. Of Crys. Growth* 59 (1982) pp. 189-195.

G. F. Neumark, "Effect of deep levels on semiconductor carrier concentrations in the case of Strong Compensation", *Physical Rev. B,* 26:4, pp. 2250-2252 (1982).

G. F. Neumark, "Are impurities the cause of self-compensation in large-band-gap semiconductors?", *J. Appl. Phys. 51:6, pp. 3383-3387 (1980).*

WIDE BAND-GAP SEMICONDUCTORS HAVING LOW BIPOLAR RESISTIVITY AND METHOD OF FORMATION

BACKGROUND OF THE INVENTION

Many devices need "good" p-n junctions made from semiconductors having a wide band-gap. A "good" p-n junction provides acceptable carrier injection accross the junction and has low series resistance in the bulk portions. "Good" p-n junctions also require adequate conductivity in both n- and p-type materials.

For example, to produce light efficiently with a semiconductor, the energy of the light emitted is less than or at most, equal to the energy of the band-gap. Because the band-gap of Si is small about (1.1 eV) it is impossible to emit blue or green light efficiently from this semiconductor The energy of the band-gap is too small.

TABLE 1

| Energy of Band Gap of Several Wide Band-Gap II-VI Semiconductors | |
|---|---|
| CdS 2.4 eV | ZnO 3.0 eV |
| CdSe 1.7 eV | ZnS 3.7 eV |
| CdTe 1.4 eV | ZnSe 2.7 eV |
|  | ZnTe 2.3 eV |

Considerable effort has been expended in attempting to develop semiconductors having both high bipolar conductivity and a wide band-gap. The energy's of several wide band-gap II-VI semiconductors is set out in Table 1. Despite this effort, suitable semiconductors of this type have not been developed. Although the "n-type" side or "p-type" side of these semiconductors often has low resistivity, at least one side has always had unacceptably high resistivity. For example, a II-VI semiconductor such as n-type ZnSe has both a wide band-gap and low resistivity. However, p-type ZnSe exhibits unacceptably high resistivity. Further, n-type ZnTe which also has a wide band-gap likewise has high resistivity.

The cause of high resistivity in either the p-type or the n-type of semiconductors having wide band-gaps is due to compensation. Compensation refers to the phenomenon in which electron donors are unintentionally present in what was intended to be p-type semiconductor or acceptors are unintentionally present in what was intended to be an n-type semiconductor. The heretofore unavoidable presence of acceptors or donors on the "wrong" side of a p-n junction in wide band-gap semiconductors unacceptably limits the utility of p-n junctions formed from materials having a wide band-gap.

Considerable effort has been expended to develop wide band-gap semiconductors having low bipolar resistivity. A general goal has been to develop p-n junctions having bipolar resistivity less than about 200 to 100 ohm·cm in either direction. Efforts to achieve these goals have included the use of molecular beam epitaxy (MBE), but this involves extremely expensive equipment and processes and any reported successes have not been suitably reproduced. Other efforts have included metal organic chemical vapor deposition (MOCVD) but again this procedure is extremely expensive and has not produced suitable results reliably.

SUMMARY OF THE INVENTION

Generally speaking, in accordance with the invention, a semiconductor is provided which has low bipolar resistivity as well as a wide band-gap and a method for producing such a semiconductor is also provided. The p-n junction formed from the semiconductor has suitably low compensation on both the p and the n side. To form this semiconductor, atomic hydrogen is used to neutralize compensating contaminants. By introducing hydrogen to the semiconductor after it is doped, the compensating impurities will be neutralized. In an alternative embodiment, the dopant and hydrogen are introduced into the substrate together and later, the hydrogen is removed.

Accordingly, it is an object of this invention to provide improved semiconductors with materials having a wide band-gap.

Another object of the invention is to provide semiconductors having low bipolar resistivity and a wide band-gap and a method of formation.

A further object of the invention is to provide low resistivity p-type ZnSe.

Still another object of the invention is to provide low resistivity n-type ZnTe.

Still another object of the invention is to provide low resistivity II-VI semiconductors.

Still other objects and advantages of the invention will in part be obvious and will in part be apparent from the specification.

The invention accordingly comprises the several steps and the relation of one or more of such steps with respect to each of the others, and the article possessing the features, the properties and the relation of elements, which are exemplified in the following detailed disclosure, and the scope of the invention will be indicated in the claims.

DETAILED DESCRIPTION OF THE PREFERRED EMBODIMENTS

To produce an adequately conducting wide band-gap semiconductor, a dopant must be introduced into a semiconductor substrate material. There are three conventional, non-esoteric methods for introducing dopants into the substrate: by diffusion, by implantation and during growth. High temperatures are necessary to introduce the dopant by the diffusion method. Dopants have smaller diffusion rates relative to hydrogen, and thus, higher temperatures are needed to induce movement. Although implantation can be carried out at lower temperatures, a subsequent high temperature annealing step is necessary to remove implantation damage to the semiconductor substrate material. Although introduction during growth can be carried out at low temperatures, in order to achieve proper solubilities, high temperatures are necessary to incorporate sufficient quantity of dopant.

Unfortunately, the conditions associated with wide band-gap semiconductor doping often lead to undesirably high "compensation." Whether it is caused by high temperatures or for other reasons, such high compensation caused by the presence of donors within p-type semiconductors, the presence of acceptors within n-type semiconductors or the presence of amphoteric impurities (amphoteric impurities are those which can act as either donors or acceptors, depending on their lattice positions) unacceptably increases the resistivity of the semiconductor. Accordingly, excessively high compensation causes wide band-gap semiconductors to have unacceptably high resistivity on at least one side of a p-n junction.

The introduction of atomic hydrogen at temperatures lower than those which will cause dopant movement (migration) will neutralize both shallow donors and shallow acceptors, depending on the temperature during incorporation. This method has already been shown to work in Silicon and GaAs. In silicon, the preferred neutralization temperature is within the range of about 100°–150° C. In GaAs it is about 250° C. A more extensive discussion can be found in Pearton, S. J., et al., Appl. Phys. 25, 153 (1987); and Johnson, N. M., et al., Phys. Rev. Lett. 56, 769 (1986); Acceptors in CdTe have been neutralized with the introduction of hydrogen at about 350° C. as further discussed in Boudoukha, A., et al., J. Cryst. Growth 72, 226 (1985). Hydrogen will also act as a donor when introduced into ZnO at about 500°–700° C. as more fully discussed in Thomas, P. G., et al., J. Chem. Phys 25, 1136 (1956). Accordingly, hydrogen can be introduced into semiconductors over a wide range of temperatures. By selecting an appropriate method of hydrogen addition at a desired temperature, compensators within II-VI semiconductors can be neutralized to yield wide band-gap semiconductors with low resistivity.

P-N junctions formed in accordance with the invention can be formed from semiconductors having band-gaps of above about 1.4 eV to 1.7 eV. In fact, semiconductors having band-gaps of more than about 2.0 eV can be used to form "good" (low resistivity on both sides) p-n junctions according to the invention. Examples of materials which can be used to form p-n junctions in accordance with the invention include those materials listed in Table 1, above.

Semiconductors formed in accordance with the invention have low bipolar resistivity. Desirable resistivities depend on intended uses. However, resistivities below about 200 ohm·cm to 100 ohm·cm are generally desirable, and are attainable in accordance with the invention.

To form adequately conducting p-n junctions having adequate carrier injection across the junction, acceptors and donors, including acceptors and donors having shallow energy levels would first be introduced so as to form the "p" and "n" side in II-VI semiconductor substrates respectively, either by diffusion, implantation or during growth. This would yield a p-n juncton having at least one highly compensated side. Hydrogen treatment would then neutralize the compensating donors or acceptors. (The side with the good conductivity would be shielded from the hydrogen, and the time of hydrogen treatment would be appropriately adjusted so that no or minimal hydrogen would diffuse to that side.) Since the hydrogen atom is so small, it diffuses easily. Therefore, it can be incorporated at relatively low temperatures of below about 400° C. and more preferably about 250° C. for example. At temperatures low enough to induce hydrogen movement, there will be acceptably minimal movement of impurities or of the compound constituents. Accordingly, there should be an acceptably low introduction of extraneous donor species and similar minimal switch of amphoteric impurities to the donor site.

Various processes for introducing atomic hydrogen into a semiconductor are known. For example, J. Chevallier, et al., Appl. Phys. Lett. 47, 108 (1985), described the use of hydrogen plasma exposure to introduce atomic hydrogen into semiconductor. One example described in Chevalier utilizes a parallel plate reactor operating at a low frequency about (30 kHz) with a plasma power density of 0.08 Wcm$^2$, and a reference voltage at the driven electrode of 280 eV. A second process for introducing atomic hydrogen described within Chevallier includes electrochemical hydrogen insertion. One example described a two electrode cell having $H_3PO_4$ as electrolyte, and a constant current density of about $10^{-2}$A/cm$^2$. In both processes for introducing atomic hydrogen, a sample temperature of 250° C. was used.

For example, to form a p-n junction from ZnSe, donor sites are formed on the n-type side. This side will typically not develop compensation problems. The introduction of sodium on the Zn site or nitrogen on the Se site within the "p-type" side of ZnSe will create desirable acceptors and thus, electron deficiencies (holes). However, undesirable donors will heretofore unintentionally and unavoidably be present within the p-type crystal lattice structure. This compensation on the "p" side will lead to unacceptable resistivity and the resulting p-n junction will not have the desired properties. The introduction of atomic hydrogen at appropriate temperatures will neutralize these donors and lead to suitably low resistivity p-type ZnSe.

By introducing atomic hydrogen into p-type ZnSe at an appropriate temperature, the undesirable donors will be neutralized, while not many of the acceptors will be. Accordingly, the resultant p-type semiconductor will have low resistivity. Because compensation is not a problem with forming n-type ZnSe, a p-n junction formed from typically highly conductive n-type ZnSe and p-type ZnSe (after hydrogen neutralized the donors), will yield a wide band-gap semiconductor having high bipolar conductivity. In this process the n-side can be shielded from the hydrogen with the time used for the introduction of the hydrogen adjusted so that there is no or minimal diffusion of hydrogen to the n-side.

This method can be used to form a p-n junction from other materials as well. For example, the n-type side of CdS, CdSe, ZnS, GaN and ZnSe will have acceptably low resistivity. However the p-type side will be highly compensated. The introduction of atomic hydrogen into the p-side will neutralize the compensating donors, with this side then having low resistivity. Likewise, hydrogen addition can be used to neutralize compensating acceptors which will be present in n-type diamond or ZnTe. Accordingly, low resistivity will be achieved on both sides of the resulting p-n junction.

Accordingly, the use of hydrogen treatment on compensated II-VI materials and other semiconductors yields semiconductors having low bipolar resistivity. By selecting appropriate temperatures, the hydrogen treatment neutralizes the compensating acceptors or donors but leaves the desired acceptors or donors effective. This results in "good" p-type conductivity in II-VI semiconductors which have never before exhibited acceptably low resistance on the "p" side, and correspondingly for "good" n-type conductivity.

In an alternative embodiment of the invention, the hydrogen is introduced along with the dopant at a relatively high temperature to the side which has compensation tendencies. This provides the compensation which the semiconductor "wants" and excludes other types of compensating agents. The hydrogen neutralizes the desired dopant and therefore effectively eliminates the tendency of additional compensating impurities or defects to form and thereby increase the resistivity of the semiconductor. Afterwards, the hydrogen is removed and a semiconductor suitably free of compensating agents remains. This alternative embodiment can produce acceptable p-type CdS, CdSe, ZnS and ZnSe along with other wide band-gap semiconductors which have a tendency to incorporate donor compensators. It will also produce acceptable n-type diamond and ZnTe as well as other semiconductors which have a tendency towards acceptor compensators.

A first method of introducing H and dopant together, into the semiconductor, is the joint diffusion method. Some dopants will diffuse at fairly low temperatures. For example, Li movement in ZnSe has been described at temperatures of about 300°–400° C. in Neumark, G. F., et al., J. Cryst Growth 59, 189 (1982). Li movement in CdTe has been described at room temperature in Lee, C. T., et al., J. Appl. Phys. 54, 7041 (1983). For a review of diffusion rates, see Casey, Jr., H. C., et al., "Point Defects in Solids," Crawford, Jr., J. H., et al., Eds., Vol. 2, p. 163 (Plenum Press, N.Y. 1975). Accordingly, a wide range of conditions and temperatures are available for the simultaneous introduction of H and dopant by joint diffusion.

A second method of simultaneous H and dopant introduction is to introduce both during crystal growth. One condition is that the growth temperature is adequately low to maintain the presence of H. Therefore, temperature of about 700° C. and below is desirable. A third technique would be by implantation.

As an example, p-type ZnSe can be produced by conventional methods at usual high temperatures. Temperatures of 400° C. and well above are normal. P-type ZnSe will have either sodium on the Zn site and/or nitrogen on the Se site. Because hydrogen is introduced along with the dopant, the acceptors will be neutralized by the hydrogen which will act as a donor. Typically, p-type ZnSe tends to become heavily compensated by donors such as Group I metals going to the interstitial sites where they act as donors. Compensation also occurs if contaminating donors are unintentionally introduced into the ZnSe substrate. Because hydrogen is present in such high availability, it will act as a compensating donor and significantly limit the presence of other donors. Once the hydrogen is removed, p-type ZnSe having suitably low compensation and accordingly, suitably low resistivity will remain.

Several methods are available for removing the hydrogen while allowing the desired acceptors or donors to remain uncompensated. For example, the material can be heated to a temperature relatively low compared to the "doping temperature." Temperatures between about 100° to 500° C. and more preferably between about 150° to 450° C. are generally effective. The actual preferable temperature depends on many factors including the specific components involved. Because hydrogen is so small, and has such a high diffusion rate, it will diffuse out while the larger members of the crystal structure remain acceptably intact. Temperatures of about 250° C. have been shown to be effective.

Other known methods for removing the added H may be used. One method is known as gettering. The semiconductor, such as the p-type ZnSe would be heated in the presence of a metal or of a defect (which can be introduced by ion bombardment, for example) which has an affinity for hydrogen. Another method for removing the hydrogen is electric field induced hydrogen drift. The sample can also be heated in vacuo or in a non-H ambient. Appropriate temperatures are in the range of about 100°–500° C. and more preferably about 150°–400° C. When using Si semiconductors, temperatures of about 150°–350° C. most preferred. Any method which would remove the hydrogen without disturbing the crystal structure and the desired dopants is acceptable.

Certain n-type semiconductors also have compensation problems which are solved by the method of the invention. For example, high conductivity n-type ZnTe having a resistivity of for high conductivity n-type ZnTe, hydrogen is introduced along with the donor dopant. The semiconductor is allowed to cool and hydrogen is then removed at a much lower temperature than at which it wa introduced, by any of the aforementioned methods. The resulting n-type ZnTe will be suitably compensation free and have suitably low resistivity.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

I claim:

1. A method of forming a p-n junction from a wide band-gap semiconductor, comprising forming an n-type side and a p-type side of a semiconductor by doping the n-type side to form an n-type semiconductor and doping the p-type side to form a p-type semiconductor, then introducing at least a sufficient quantity of atomic hydrogen into at least one side of the doped semiconductor to neutralize a portion of the compensators of at least that side to reduce the resistivity of at least that side to yield a wide band-gap semiconductor having reduced resistivity on at least that side.

2. The method of preparing the p-n junction of claim 1, wherein atomic hydrogen is introduced into the n-type side of the semiconductor.

3. The method of forming the p-n junction of claim 1, wherein atomic hydrogen is introduced into the p-type side of the semiconductor.

4. The method of forming the p-n junction of claim 1, wherein atomic hydrogen is incorporated at a temperature of about 250° C.

5. The method of forming the p-n junction of claim 1, wherein the p-type side is p-type ZnSe.

6. The method of forming the p-n junction of claim 1, wherein the semiconductor is a II-VI semiconductor.

7. The method of forming the p-n junction of claim 1, wherein atomic hydrogen is introduced by hydrogen plasma exposure.

8. The method of forming the p-n junction of claim 1, wherein atomic hydrogen is introduced by electrochemical hydrogen insertion.

9. The method of forming the p-n junction of claim 1, wherein atomic hydrogen is introduced at a temperature below about 400° C.

10. A method of forming a low resistivity semiconductor from a wide band-gap semiconductor substrate that has a tendency to become compensated when it is doped, comprising selectively doping the semiconductor substrate with an effective amount of dopant to induce acceptable conductivity, together with an effective amount of atomic hydrogen to act as a compensator and block unacceptably high occurrences of other compensators, then removing an effective amount of the added hydrogen to reduce the resistivity of the semiconductor, the hydrogen removed under conditions to limit other movement within the semiconductor.

11. The method of forming the low resistivity semiconductor of claim 10, wherein the semiconductor is a II-VI semiconductor.

12. The method of forming the low resistivity semiconductor of claim 10, wherein the hydrogen is removed by heating the semiconductor to an effective temperature for inducing hydrogen movement while the remainder of the semiconductor remains acceptably stable.

13. The method of forming the low resistivity semiconductor of claim 12, wherein the heating for the removal of hydrogen is carried out in vacuo.

14. The method of forming the low resistivity semiconductor of claim 10, wherein the hydrogen is removed by gettering.

15. The method of forming the low resistivity semiconductor of claim 10, wherein the hydrogen is removed by electric field induced hydrogen drift.

16. The method of forming the low resistivity semiconductor of claim 10, wherein the sample is heated in a non-hydrogen ambient, for removal of hydrogen.

17. The method of forming the low resistivity semiconductor of claim 13, wherein the semiconductor is heated to a temperature between about 100° to 500° C. for the removal of hydrogen.

18. The method of forming the low resistivity semiconductor of claim 13, wherein the semiconductor is heated to a temperature between about 150° to 400° C.

19. The method of forming the low resistivity semiconductor of claim 16, wherein the semiconductor is heated to a temperature between about 100° to 500° C. for the removal of hydrogen.

20. The method of forming the low resistivity semiconductor of claim 16, wherein the semiconductor is heated to a temperature between about 150° to 400° C.

21. The method of forming a low resistivity semiconductor of claim 16, wherein the semiconductor is selected from the group consisting of CdS, CdSe, CdTe, ZnO, ZnS, ZnSe, ZnTe.

22. A method of forming low resistivity semiconductor from a wide band-gap semiconductor substrate having unacceptably high resistivity due to excessive compensators, by introducing at least an effective quantity of atomic hydrogen into the semiconductor substrate to neutralize an acceptable portion of the compensators.

* * * * *